United States Patent [19]

Berggren

[11] Patent Number: 4,529,929
[45] Date of Patent: Jul. 16, 1985

[54] METHOD OF DETECTING GROUND FAULTS IN A NETWORK FOR DISTRIBUTION OF ELECTRIC POWER AND A DEVICE FOR CARRYING OUT THE METHOD

[75] Inventor: Jan Berggren, Västerås Frölunda, Sweden

[73] Assignee: Asea Aktiebolag, Västerås, Sweden

[21] Appl. No.: 437,634

[22] Filed: Oct. 29, 1982

[30] Foreign Application Priority Data

Nov. 2, 1981 [SE] Sweden .................................. 8106436

[51] Int. Cl.³ ...................... G01R 31/02; G01R 31/08
[52] U.S. Cl. ....................................................... 324/52
[58] Field of Search ............................ 324/51, 52, 54

[56] References Cited

U.S. PATENT DOCUMENTS 3,609,534  9/1971  Gurevitch ............................. 324/52
3,800,215  3/1974  Souillard ............................... 324/52
4,408,155  10/1983  McBride ............................... 324/51

Primary Examiner—Stanley T. Krawczewicz
Assistant Examiner—Jose M. Solis
Attorney, Agent, or Firm—Watson Cole Grindle & Watson

[57] ABSTRACT

A method and a device for detecting ground faults in a network for distribution of electric power from a power station from which a number of lines, included in the network, emanate and where the ground fault current $I_J$ of each line is measured. According to this method, that line is selected (10) which shows the greatest active ground fault current $I_{JR}$ (8), alternatively the greatest ground fault current $I_J$, or the greatest change in the ground fault current $\Delta I_J$. Thereafter, the measured ground fault current, or the change thereof, in the selected line is compared (12) with at least one predetermined reference value (11). A fault indication is obtained (13) at a level exceeding the reference value.

26 Claims, 2 Drawing Figures

METHOD OF DETECTING GROUND FAULTS IN A NETWORK FOR DISTRIBUTION OF ELECTRIC POWER AND A DEVICE FOR CARRYING OUT THE METHOD

TECHNICAL FIELD

The present invention relates to a method of detecting ground faults in a network for distribution of electric power from a power station, from which a number of lines, included in the network, emanate, and to a device for carrying out this method.

Radially supplied distribution networks have to be protected against ground faults in such a way that a component or a line, on which a fault has occurred, is automatically disconnected by means of its circuit-breaker. This is necessary in order to minimize the risk of personal injury and fires.

The embodiment of a ground fault protection device is substantially determined by the size of the network, its grounding and the regulations which apply to electric heavy current installations as regards permissible voltages in case of a ground fault on a grounded component. Because of the different appearances of the networks, several different types of measurement criteria are therefore used at the present.

The following symbols with the respective designations are to be found in the ensuing text:

$X_C$ = the capacitive reactance of the network to ground ($\Omega$/phase)
$X_N$ = the reactance of the neutral point reactor ($\Omega$)
$R_0$ = the inner resistance of the neutral point reactor ($\Omega$)
$U_o$ = the neutral point voltage of the network (V)
$U$ = the phase voltage of the network (V)
$(U_0/U) \times 100$ = the degree of propagation of the ground fault (%)
$I_J$ = the ground fault current of the network (A)
$I_{JR}$ = the component of the ground fault current which is in phase with the neutral point voltage $U_o$ (A)
$\hat{I}_{JR}$ = the peak value of $I_{JR}$ (A)
$\Delta I_J$ = the alteration of the ground fault current of the network (A)
$R_F$ = transition resistance to ground at the site of the fault ($\Omega$)

PRIOR ART

As mentioned above, detection of ground faults is carried out in several ways, among other things depending on if and how the network is grounded.

An ungrounded network, i.e. when $R_N = X_N = \infty$, may occur when the total length of the line of the network is not too large. In that way, the ground fault current is limited by the capacitive reactance of the network to ground ($X_C$) and possibly by the transition resistance $R_F$ at the site of the fault. In this connection directional overcurrent relays are used, which are sensitive to ground fault currents which are capacitive relative to the neutral point voltage.

Direct-grounded networks, i.e. when $R_N = X_N = 0$, occur very rarely at distribution network level since the ground fault current ($I_J$) may assume very high values. Since direct grounding means that $U_0$ is zero, only the ground fault current is utilized for selective ground fault detection or disconnection of a faulty line.

Grounding via a neutral point resistor where $R_N$ is greater than 50 $\Omega$ occurs in small and medium-sized networks. The neutral point resistor $R_N$ is selected so that sufficient active, or as it is also called, resistive current, i.e. current which is in phase with the neutral point voltage, is obtained in case of a ground fault. The network is protected by directional overcurrent relays which are sensitive to resistive ground fault current and which are fed with the current which passes via the neutral point resistor.

Grounding by means of a neutral point reactor $X_N$ and a neutral point resistor $R_N$ occurs in large-sized networks where the capacitive ground fault current would otherwise become too high. The capacitive ground fault current is compensated with the neutral point reactor in such a way that a tuned network is obtained. For selective disconnection of a faulty component there are used directional overcurrent relays which are sensitive to resistive ground fault current, i.e. the current through the neutral point resistor. Sometimes there may be provided a special automatic system which handles the disconnection and connection of the neutral point resistor, so that a chance of self-extinction of the fault is given, before a relay starts functioning and disconnects the line.

Grounding with a neutral point reactor $X_N$ occurs in very large networks. Otherwise, the same applies as when grounding with a reactor and a resistor; however, it is assumed that the inner resistance $R_0$ of the neutral point reactor shall be sufficiently high to permit evaluation of a resistive current component.

TECHNICAL PROBLEM

The components and systems for ground fault measurement, identification and disconnection which are used today cannot be made identical because of different principles of grounding, as should be partly clear from what has been stated above. Nor can the desirable sensitivity and speed be achieved.

In direct-grounded networks, however, theoretically a relatively high sensitivity of the ground fault protection devices can be obtained, with a possibility of selective detection of faults with high transition resistances. However, as mentioned above, the grounding is less frequent because of the very high ground fault currents that may occur.

Ungrounded networks also give relatively good possibilities of selective detection of ground faults with high transition resistance. However, ungrounded networks are less common since only small networks can then be used. Furthermore, it is normally desired to avoid ungrounded networks in view of the risk of intermittent ground faults.

In networks which are resistance-grounded with an $R_N$ corresponding to a ground fault current of 2–15 A, and networks with reactor grounding together with resistance grounding, directional overcurrent relays which are sensitive to resistive ground fault currents provide varying sensitivity to ground faults with a high transition resistance. The sensitivity largely depends on the size of the network. However, generally it can be said that large networks give limited possibilities of good selective detection of high-ohmic ground faults.

The three most important reasons for the limited sensitivity of directional overcurrent relays which are sensitive to resistive ground fault current are the following:

In case of low ground fault currents, where the capacitive or the inductive component is perdominant, the angular fault of the current transformer may cause incorrect measurement.

In case of faults with a low degree of propagation, power relays and directional overcurrent relays have difficulties in measuring $I \times \cos \phi$ at great $\phi$, i.e. in the range $\phi = 80°-90°$.

For practical reasons it is not possible to set the sensitivity of the relays at an arbitrarily high value. This may have several reasons, such as leakage currents at insulators, spontaneous contacts with vegetation, or salt storms near ocean coasts. Too high a sensitivity of the ground fault protection devices would therefore result in unjustified trippings.

There is an explicit desire on the part of the power utilities to be able to detect ground faults with higher transition resistance $R_F$ at the site of the fault than what can be handled today ($\sim 3$ k$\Omega$).

It is a well-known fact that ground faults which cannot be located and disconnected in time may lead to personal injury or to fire. In this connection so-called reversed ground faults should be of special interest, i.e. faults where a phase has an interruption and a ground fault occurs in the phase after the place of the interruption with power supply via the load object. In the present situation, these faults may remain undiscovered for a long period of time.

There is a desire to standardize the relay protection devices so that the same components and systems can be used for different networks, independently of the size of the network, grounding, etc.

ADVANTAGES

The technical problems which have been described can substantially be overcome and said desires be fulfilled by means of methods and devices according to this invention, the characteristic features thereof being clear from the claims.

Among the advantages that may be gained the following could be mentioned:

Considerably higher sensitivity to ground faults with high transition resistance.

A uniform and general protection which is suitable for all types of networks.

The demand for current transformers can be considered moderate in view of the fact that systematic deviations are compensated away.

Savings can be made in high voltage equipment, such as neutral point resistors, which does not have to withstand too high power.

Good economy in case of large-sized stations.

High flexibility in view of special operating demands.

Improved possibilities of automatic supervision of the relay protection system. This can be done so that the measuring unit supervises itself and that so-called routine tests of the whole relay system are made at regular intervals with a special computer.

The system can easily be supplemented with an automatic system for reclosing and a neutral point automatic system without any major costs.

SOLUTION OF THE PROBLEMS

The principle of the method proposed by the invention for solving the above-mentioned problems will be clear from the claims and from the following:

The ground fault current ($I_J$) for each line is measured and the line, which shows the greatest resistive ground fault current ($I_{JR}$), or the greatest ground fault current ($I_J$), or the greatest change in the ground fault current ($\Delta I_J$), is selected, whereafter the measured resistive ground fault current ($I_{JR}$), or ground fault current ($I_J$), or change thereof in the selected line is compared with at least one predetermined reference value and a fault indication is obtained at a level exceeding said reference value. The resistive ground fault current for all lines is measured instantaneously when the rate of change of the neutral point voltage changes signs, i.e. $I_{JR}$ is measured, whereafter the measured values are added for each line, so that the sum becomes a measure of the amount of the active component of the ground fault current. Alternatively, the ground fault current ($I_J$) can be measured instantaneously for all the lines on a plurality of measurement occasions during each cycle of power frequency and a specified number of the measured values be summed up for each line back in time in order to thus form a measure of the amount of said ground fault current. The difference between measured value on one measuring occasion and measured value on a corresponding measuring occasion during the preceding period is continuously formed. The sum of the amounts of the individual differences—obtained for each measuring occasion—in ground fault current during two periods of power frequency is formed, from where the change in ground fault current ($\Delta I_J$) is created. The measurement of the ground fault current ($I_{JR}$) is initiated and proceeds for as long as the neutral point voltage ($U_0$) of the network reaches a certain predetermined value.

In the means proposed by the invention for solving the above-mentioned problems there are included members for measuring the ground fault current ($I_J$) for each line, members for selecting the line which shows the greatest active ground fault current ($I_{JR}$), the greatest ground fault current ($I_J$), or the greatest change in ground fault current, members for comparing measured resistive ground fault current ($I_{JR}$), or measured ground fault current ($I_J$), or the change thereof, with at least one predetermined reference value, and members for delivering a fault-indicating output signal at a level exceeding the reference value.

The above-mentioned members comprise an interface unit, arranged for each line and arranged to receive at its input the ground fault current ($I_J$) of the respective line, and a measuring unit for the ground fault current connected after the interface units, said measuring unit having an output arranged for each line, said outputs being arranged to deliver fault indicating output signals.

Said members also comprise a measuring unit for neutral point voltage ($U_0$) arranged to receive neutral point voltage at its input and to deliver an output signal at its output, said output signal—if the amplitude reaches a predetermined value—giving information about the time when the rate of change of the neutral point voltage changes sign.

Said measuring unit for ground fault current ($I_J$) is arranged to measure both the change in ground fault current ($\Delta I_J$) and the absolute value of the ground fault current or its active component and, at a value exceeding a predetermined reference value, to deliver a fault indicating output signal.

The object of the invention is to measure and mutually compare the ground fault current ($I_J$) of all the lines. The greatest of the currents is compared with a set reference.

There are two methods for measuring $I_J$. One method (Measuring method 1) measures the instantaneous value of the current twice every power frequency cycle at a time corresponding, in phase, to 90° after the zero passage of the neutral point voltage, i.e. the peak value of the resistive ground fault current component is measured. This method consequently requires a neutral point resistor but is otherwise independent of the embodiment of the network.

In the second method of measuring $I_J$ (Measuring method 2), the instantaneous value is measured at times which are controlled by an interval clock. In principle, this method requires no measurement of the neutral point voltage $U_0$ as the synchronization to power frequency takes place by means of the interval clock. Nor does this method place any demands on the neutral point resistor, whether it exists or not.

The simultaneous measurement of the peak value of all the lines as regards resistive ground fault current, and as regards measurements of instantaneous value controlled by the interval clock, is made possible owing to the use of a multi-channel, so-called multiplexed A/D convertor, i.e. a very fast signal switch with analog input and digital output.

BRIEF DESCRIPTION OF DRAWINGS

The invention will now be described by way of two embodiments with reference to the accompanying drawings.

DESCRIPTION OF EMBODIMENTS

Figure 1:
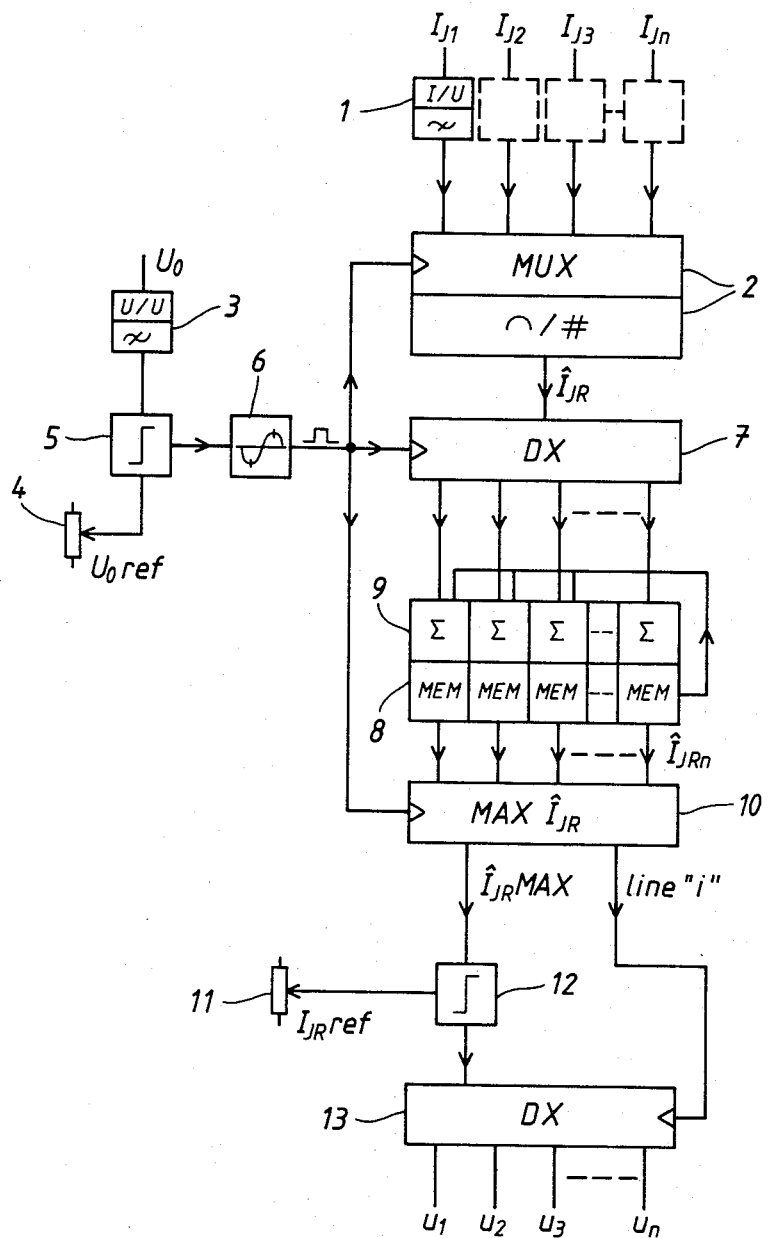
FIG. 1 shows the case where only the peak value of the ground fault current component which is in phase with the neutral point voltage is utilized. Block No. 2 designates a multiplexed A/D convertor. Blocks Nos. 7 and 13 designate a demultiplexer. Block No. 10 designates a maximum value detector, i.e. an element which scans a number of incoming signals and finds out which is the greatest. The maximum value detector has two outputs, one indicating the maximum value and the other indicating which of the incoming lines has the maximum value.

In principle, an embodiment of the invention when using Measuring method 1 can be described with reference to FIG. 1. The ground fault currents of all lines, which normally are practically zero, are available in the form of the signals $I_{J1}$, $I_{J2}$ and so on. The measured current passes through an interface unit (1) in which the current signal is transformed into a suitable voltage and in which also filtering takes place. Each line has its own interface unit. The output from the interface units is arranged to be connected to a multiplexed A/D convertor (2). The device comprises a measuring unit (3) for measuring the neutral point voltage. When said voltage exceeds a set reference value $U_{0ref}$ (4), the threshold element (5) is opened for passage of $U_0$ to the control pulse device (6) of the multiplexed A/D convertor. This device (6) emits a start impulse to the multiplexed A/D convertor each time that $U_0$ passes a maximum. At that time, measurement of the instantaneous value of all the line currents takes place. This value corresponds to the peak value of that component of the ground fault current which is in phase with the neutral point voltage. The multiplexed A/D convertor supplies a digital value for each line which corresponds to $I_{JR}$. These values are supplied to a demultiplexer (7) which is controlled by the same control pulse device (6), whereupon the measured values are supplied to and stored in a memory (8) for each line. The next time the pulse device (6) delivers a start impulse, i.e. the next that $U_0$ passes a maximum value, a new measurement of $I_{JR}$ for each line takes place. The digital value is added in the summator (9) to the value which is present in the respective memory (8). In time with the supply of pulses of the pulse device (6) all the memories (8) are scanned by a maximum value detector (10). From the maximum value detector information is obtained about the maximum, added value and about the line that has this value. The current value is compared with a set reference value $I_{JRref}$ (11) and when the current value becomes greater than $I_{JRref}$ the demultiplexer (13) receives a signal. The demultiplexer is controlled via line information from the maximum value detector (10) so that the line which has such a great ground fault current that the corresponding signal passes the threshold element, receives a tripping signal u.

Figure 2:
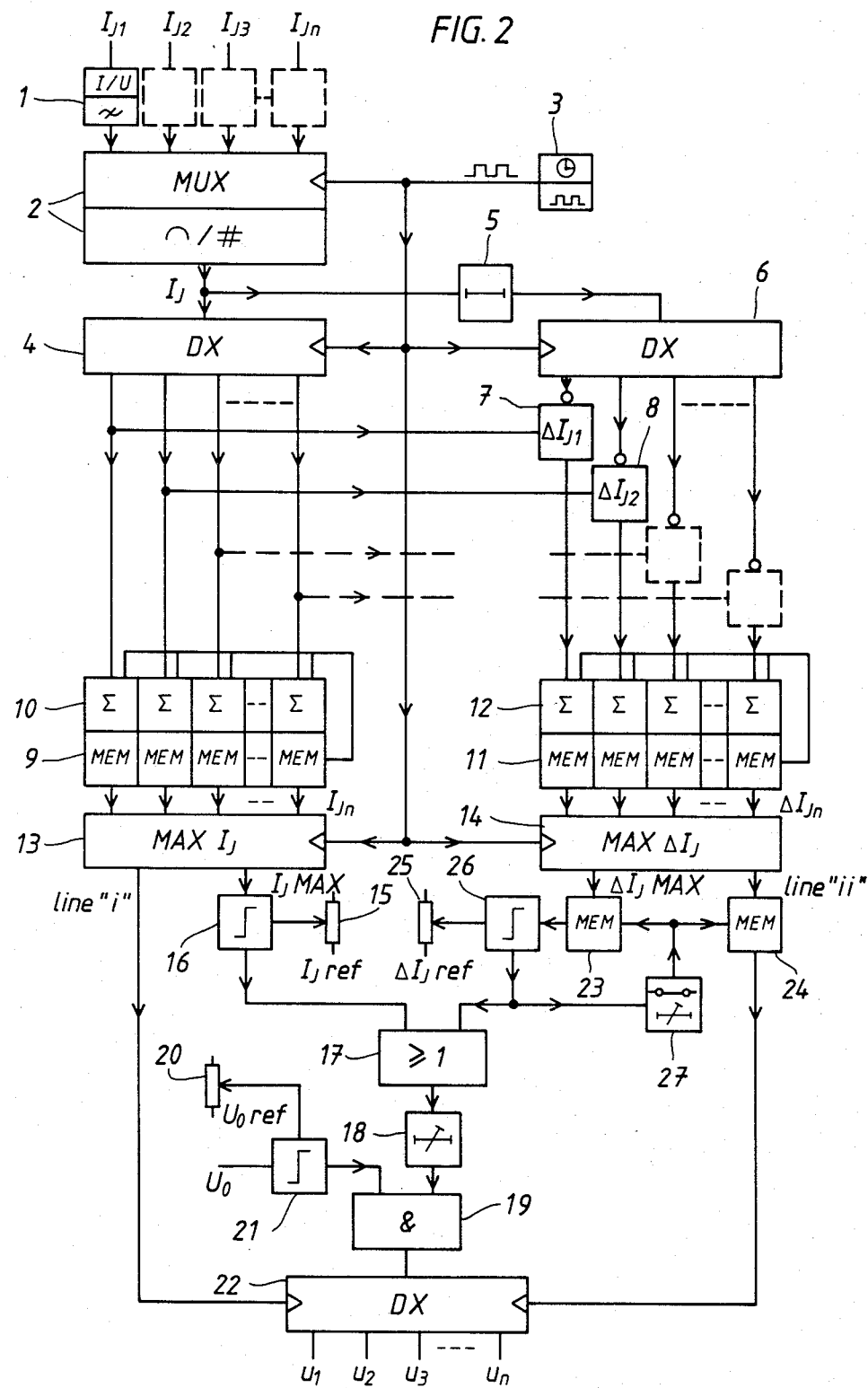
FIG. 2 shows an embodiment which monitors both the ground fault current as such and the change in the ground fault current and allows the currents which first reaches a reference value, set in advance for each of the currents, to cause a tripping signal.

In principle, an embodiment of the invention when using Measuring method 2 can be described with reference to FIG. 2. The ground fault currents of all the lines are available in the form of signals $I_{J1}$, $I_{J2}$ and so on. The measured current passes through an interface unit (1) where the current signal is transformed into a suitable voltage and where also filtering takes place. Each line has its own interface unit. The output from the interface units is arranged to be connected to a multiplexed A/D convertor (2). The device comprises an interval clock (3). The clock (3) generates start pulses to the multiplexed A/D convertor a fixed number of times each cycle. The start pulses return with the same intermittence and the n:th pulse in a cycle recurs in the next cycle at the same phase position relative to the supplying network. Each instantaneous value, measured for each line and converted into a digital value, is supplied partly directly to a demultiplexer (4), partly via a time delay (5) of one cycle to another demultiplexer (6). The demultiplexers (4) and (6) are controlled by the interval clock (3) with the same start pulses as the multiplexed A/D convertor (2). The difference between the instantaneous value of each line and the corresponding value one cycle previously for each measuring occasion is obtained by means of the difference generators (7), (8) and corresponding difference generators for the other lines. The values conveyed by the demultiplexer (4) are supplied to a memory (9). Each time that the interval clock (3) delivers a start pulse, a new measured value is added for each line. A summation of the measured values for each cycle is obtained by the summators (10). The value received for each cycle represents a measure of the ground fault current during this cycle. An updating of the memory takes place for each cycle. The same procedure is repeated for the values which represent the change currents, i.e. the output signals from the difference generators (7), (8), etc., which are supplied to a memory (11) and are processed in a summator (12). The only difference is that a change of the ground fault current $\Delta I_J$ is formed as the sum of the amounts of the individual differences—obtained for each measuring occasion—in ground fault current during two cycles of power frequency. In the maximum value detectors (13) and (14), which are also controlled by the interval clock (3), all the values are scanned and at the outputs there is obtained information about which line (line "i") has the greatest ground fault current $I_J$ and a value corresponding to the magnitude of the current, and about which line (line "ii") has the greatest change current $\Delta I_{JL}$ and a measure of the value. The current value $I_J$MAX is compared with a reference value $I_J$ref (15). The threshold element (16) delivers a signal to the or-element (17) when $I_J$MAX>$I_J$ref. The output of the or-element (17) is connected via a settable time delay element (18) to the and-element (19). The second criterion of a tripping signal (u) being supplied is that the neutral point voltage exceeds a set reference value $U_0$ref (20). The threshold element (21) delivers a signal to the and-element (19) when $U_0$>$U_0$ref. The output of the and-element (19) is connected to the demultiplexer (22) which, with the aid of the line information line "i" supplies a tripping signal (u) to a faulty line. The output signals of the maximum value detector (14) are each led to a memory (23 and 24). These memories are set to zero and are continuously updated for each scanning operation in the maximum value detector. The output from the memory (23) which corresponds to $\Delta I_J$MAX is compared with a set reference value $\Delta I_J$ref (25), and when $\Delta I_J$MAX>>$\Delta I_J$ref the threshold element (26) gives an output signal which is supplied as a second input signal to the or-element (17). The output signal of the threshold element (26) is also supplied to a locking element (27) which, when a signal is received, blocks the memories (23 and 24) for a certain time. This arrangement is necessary to ensure that the information from the maximum value detector (14) is maintained after the time delay caused by the element (18). The line information (line "i") for controlling the tripping operation to the correct line is then maintained and is supplied to the demultiplexer (22).

I claim:

1. Device for detecting ground faults in networks for distribution of electric power from a power station from which a number of lines, included in the network, emanate and where the active ground fault current $I_{JR}$ of each line is measured, comprising means for selecting the line having the greatest active ground fault current $I_{JR}$, means for comparing the measured active ground fault current in the selected line with at least one predetermined reference value, and means for producing a fault-indicating output signal with said measured active ground fault current exceeding the reference value.

2. Device according to claim 1 further comprising an interface unit for receiving the measured active ground fault current $I_{JR}$ of each respective line, and means for synchronously controlling said interface unit and said means for selecting, and said means for producing having one output for each line, which outputs are fault-indicating signals.

3. Device according to claim 2 wherein said means for synchronously controlling includes a measuring unit for comparing the neutral point voltage $U_0$ with a predetermined value and to produce an output signal when the rate of change of the neutral point voltage changes signs.

4. Device according to claim 2 wherein said means for synchronously controlling includes means for generating clock signals for synchronous control of said interface unit and said means for selecting.

5. Method of detecting ground faults in networks for distribution of electric power from a power station from which a number of lines, included in the network, emanate by measuring the ground fault current $I_J$ for each line,
   selecting the line having the greatest ground fault current $I_J$, comparing the measured ground fault current in the selected line with at least one predetermined reference value, and deriving a fault indication at a level exceeding the reference value.

6. Method according to claim 5 including continuously forming the difference between the measured value on one measuring occasion and the measured value on a corresponding measuring occasion during the preceding cycle.

7. Method according to claim 5, wherein the ground fault current $I_J$ is measured instantaneously on a plurality of measuring occasions during each cycle of the power frequency, and adding a specified number of the measured values for each line in synchronism to form a measure of the amount of said ground fault current $I_J$.

8. Method according to claim 7 including continuously forming the difference between the measured value on one measuring occasion and the measured value on a corresponding measuring occasion during the preceding cycle.

9. Device for detecting ground faults in networks for distribution of electric power from a power station from which a number of lines, included in the network, emanate and where the ground fault current $I_J$ of each line is measured, comprising means for selecting the line having the greatest change $\Delta I_J$ in ground fault current, means for comparing the change in ground fault current $\Delta I_J$ in the selected line with at least one predetermined reference value, and means for producing a fault-indicating output signal with said measured change in the ground fault current exceeding said reference value.

10. Device according to claim 9 further comprising an interface unit for receiving the measured ground fault current $I_J$ of each respective line, and means for synchronously controlling said interface unit and said means for selecting, and said means for producing having one output for each respective line, which outputs are fault-indicating signals.

11. Device according to claim 10 further comprising a measuring unit for comparing the neutral point voltage $U_0$ with a predetermined value and to produce an output signal when the rate of change of the neutral point voltage changes signs.

12. Device according to claim 10 wherein said means for synchronously controlling includes means for generating clock singals for synchronous control of said interface unit and said means for selecting.

13. Device for detecting ground faults in networks for distribution of electric power from a power station from which a number of lines, included in the network, emanate and where the ground fault current $I_J$ of each line is measured, comprising means for selecting the line having the greatest ground fault current $I_J$, means for comparing the measured ground fault current in the selected line with at least one predetermined reference value, and means for producing a fault-indicating output signal with said measured ground fault current exceeding the reference value.

14. Device according to claim 13 wherein said measuring unit for ground fault current $I_J$ is arranged to measure both the change in the ground fault current $\Delta I_J$ and the absolute value of the ground fault current or its active component, and, at a value exceeding a predetermined reference value, to deliver a fault-indicating output signal.

15. Device according to claim 7, further comprising an interface unit for receiving the ground fault current $I_J$ of each respective line, and means for synchronously controlling said interface unit and said means for selecting, and said means for producing having one output for each line, which outputs are fault-indicating output signals.

16. Device according to claim 15 wherein said means for synchronously controlling includes means for generating clock signals for synchronous control of said interface unit and said means for selecting.

17. Device according to claim 15, further comprising a measuring unit for comparing the neutral point voltage $U_0$ with a predetermined value and to produce an output signal when said neutral point voltage $U_0$ is > than said predetermined value.

18. Device according to claim 15 wherein said measuring unit for ground fault current $I_J$ is arranged to measure both the change in the ground fault current $\Delta I_J$ and the absolute value of the ground fault current or its active component, and, at a value exceeding a predetermined reference value, to deliver a fault-indicating output signal.

19. Device according to claim 17 wherein said measuring unit for ground fault current $I_J$ is arranged to measure both the change in the ground fault current $\Delta I_J$ and the absolute value of the ground fault current or its active component, and, at a value exceeding a predetermined reference value, to deliver a fault-indicating output signal.

20. Method of detecting ground faults in networks for distribution of electric power from a power station from which a number of lines, included in the network, emanate by measuring the ground fault current $I_J$ for each line,
   selecting the line having the greatest change $\Delta I_J$ in the ground fault current $I_J$,
   comparing the change $\Delta I_J$ in measured ground fault current in the selected line with at least one predetermined reference value, and
   deriving a fault indication at a level exceeding the reference value.

21. Method according to claim 20 including continuously forming the difference between the measured value on one measuring occasion and the measured value on a corresponding measuring occasion during the preceding cycle.

22. Method of detecting ground faults in networks for distribution of electric power from a power station from which a number of lines, included in the network, emanate by measuring the active ground fault current $I_{JR}$ for each line,
   selecting the line having the greatest active ground fault current $I_{JR}$,
   comparing the measured active ground fault current in the selected line with at least one predetermined reference value, and
   deriving a fault indication at a level exceeding the reference value.

23. Method according to claim 21, including further determining when the rate of change of the neutral point voltage changes signs and wherein the ground fault current $I_{JR}$ is measured instantaneously when the rate of change of the neutral point voltage changes signs, and adding the measured values for each line so that the sum becomes a measure of the amount of the active component of the ground fault current.

24. Method according to claim 23 including forming the sum of the amounts of the individual differences, obtained for each measuring occasion, in ground fault current $I_J$ during two cycles of power frequency, and generating the change in ground fault current $\Delta I_J$.

25. Method according to claim 23 including initiating the measuring of the ground fault current $I_{JR}$ and measuring for as long as the measured neutral point voltage $U_0$ of the network attains a certain predetermined value.

26. Method according to claim 22 including continuously forming the difference between the measured value on one measuring occasion and the measured value on a corresponding measuring occasion during the preceding cycle.

* * * * *